(12) United States Patent
Wang et al.

(10) Patent No.: US 11,735,696 B2
(45) Date of Patent: Aug. 22, 2023

(54) LIGHT-EMITTING DIODE, AND LIGHT-EMITTING DIODE PACKAGE, LIGHT-EMITTING DIODE MODULE AND DISPLAY DEVICE INCLUDING THE SAME

(71) Applicant: XIAMEN SAN'AN OPTOELECTRONICS CO., LTD., Hongtang Town (CN)

(72) Inventors: Feng Wang, Xiamen (CN); Zhanggen Xia, Xiamen (CN); Yu Zhan, Xiamen (CN); En-song Nie, Xiamen (CN); Anhe He, Xiamen (CN); Kang-Wei Peng, Xiamen (CN); Su-Hui Lin, Xiamen (CN)

(73) Assignee: XIAMEN SAN'AN OPTOELECTRONICS CO. LTD., Fujian Province (CN)

( * ) Notice: Subject to any disclaimer, the term of this patent is extended or adjusted under 35 U.S.C. 154(b) by 0 days.

(21) Appl. No.: 17/072,223

(22) Filed: Oct. 16, 2020

(65) Prior Publication Data

US 2021/0119086 A1    Apr. 22, 2021

(30) Foreign Application Priority Data

Oct. 18, 2019    (CN) .......................... 201910996117.2

(51) Int. Cl.
  *H01L 33/46*    (2010.01)
  *H01L 25/075*    (2006.01)
  *H01L 33/00*    (2010.01)

(52) U.S. Cl.
  CPC .......... *H01L 33/46* (2013.01); *H01L 25/0753* (2013.01); *H01L 33/0095* (2013.01); *H01L 2933/0025* (2013.01)

(58) Field of Classification Search
  CPC .. H01L 33/46; H01L 2933/0025; H01L 33/44
  See application file for complete search history.

(56) References Cited

U.S. PATENT DOCUMENTS

| | | | |
|---|---|---|---|
| 2010/0051987 A1* | 3/2010 | Katsuno | H01L 33/38 257/98 |
| 2011/0133242 A1* | 6/2011 | Choi | H01L 33/38 257/99 |
| 2012/0199860 A1* | 8/2012 | Hodota | H01L 33/405 257/98 |
| 2015/0333230 A1* | 11/2015 | Moon | H01L 33/46 257/88 |
| 2016/0329461 A1* | 11/2016 | Huang | H01L 33/60 |
| 2018/0166610 A1* | 6/2018 | Minato | H01L 33/32 |

* cited by examiner

*Primary Examiner* — Feifei Yeung Lopez
(74) *Attorney, Agent, or Firm* — Thomas | Horstemeyer, LLP

(57) ABSTRACT

A light-emitting diode (LED) includes a light-transmissive substrate which has a first surface, an epitaxial structure which is disposed on the first surface, a first insulation layer, and a second insulation layer. The epitaxial structure has an upper surface opposite to the first surface, and a side wall interconnecting the upper surface and the first surface. The first insulation layer covers the side wall and the upper surface. The second insulation layer covers a portion of the first surface that is not covered by the epitaxial structure and the first insulation layer, and has a light transmittance greater than that of the first insulation layer. An LED package, an LED module, and a display device including the LEDs are also disclosed.

25 Claims, 10 Drawing Sheets

LIGHT-EMITTING DIODE, AND LIGHT-EMITTING DIODE PACKAGE, LIGHT-EMITTING DIODE MODULE AND DISPLAY DEVICE INCLUDING THE SAME

CROSS-REFERENCE TO RELATED APPLICATION

This application claims priority of Chinese Invention Patent Application No. 201910996117.2, filed on Oct. 18, 2019.

FIELD

This disclosure relates to a semiconductor device, and more particularly to a light-emitting diode (LED).

BACKGROUND

As compared with a conventional light-emitting diode (LED), a mini LED having a relatively smaller size can be used directly in applications such as backlight source and display devices. When a plurality of the mini LEDs are used as a backlight source, delicate light adjustments may be achieved, rendering a higher contrast ratio, a higher luminance uniformity, and an excellent color expressivity. When the mini LEDs are used in a display device, a spacing between two adjacent ones of the mini LEDs may be reduced to improve a resolution of the display device, thereby improving a visual impact thereof. The mini LED is usually packaged as a flip-chip, a face up chip, or a vertical chip, among which the flip-chip LED has become a major focus in the LED industry due to advantages such as increased light extraction efficiency, increased heat dissipation ability, improved package reliability, and improved production yield.

Referring to FIG. 1, a conventional flip-chip LED includes a substrate 1, an epitaxial structure which includes a first-type semiconductor layer 2, an active layer 3 and a second-type semiconductor layer 4 sequentially disposed on the substrate 1 in such order, a contact electrode 5 which is disposed on the second-type semiconductor layer 4, and first and second electrodes 7, 8 which are respectively electrically connected to the first-type and second-type semiconductor layers 2, 4. During a conventional packaging process for the flip-chip LED, a passivation layer 6 is usually formed to enwrap the epitaxial structure, so as to prevent electrical leakage caused by leakage of solder paste during the packaging process. In order to completely cover a side wall of the epitaxial structure, a portion of the epitaxial structure is usually removed by etching to partially expose the substrate 1, and then the passivation layer 6 is formed on an upper surface and the side wall of the epitaxial structure, and the exposed portion of the substrate 1 (serving as a cutting region for separating the LED chips). The passivation layer 6 usually has an optical thickness that is equal to an integer multiple of one-quarter of an emission peak wavelength of light (i.e., $\lambda/4$) emitted from the active layer 3, so as to ensure that the light exits the LED from a surface of the substrate 1 opposite to the epitaxial structure. However, the thickness of the passivation layer 6 covering the side wall of the epitaxial structure often does not meet the requirements for light-transmittance due to a shadow effect of existing coating techniques for the passivation layer 6. Therefore, a reflectance of the passivation layer 6 might be adversely affected, and light emitted from the epitaxial structure might undergo secondary reflection (illustrated by dotted arrow lines in FIG. 1) by the passivation layer 6 that covers the cutting region of the flip-chip LED (i.e., the exposed portion of the substrate 1), which might result in light loss. In addition, a width of the cutting region is generally required to be at least 10 μm given the limitations of a conventional scribing technique or a wafer breaking technique for obtaining separated LED chips. As shown in FIG. 2, an area percentage of the cutting region on the flip-chip LED increases to as high as 40% with a decreased size of the flip-chip LED, which might further increase light loss caused by secondary reflection at the cutting region.

Furthermore, since the epitaxial structure and the cutting region are covered by the passivation layer 6, a relatively high compressive strain might be formed at the cutting region, and when a thickness of the flip-chip LED is reduced to be not greater than 60 μm, the flip-chip LED might suffer from severe bowing, which might result in breakage. With a decreased size of the LED and an increased area percentage of the cutting region, the bowing of the flip-chip LED might be intensified. Therefore, there is still a need to develop an LED exhibiting a reduced light loss and compressive strain at the cutting region.

SUMMARY

Therefore, an object of the disclosure is to provide a light-emitting diode (LED), a light-emitting diode package, a light-emitting diode module, and a display device that can alleviate or eliminate at least one of the drawbacks in the prior art.

According to the disclosure, the LED includes a light-transmissive substrate, an epitaxial structure, a first insulation layer, and a second insulation layer. The light-transmissive substrate has a first surface. The epitaxial structure is disposed on the first surface of the light-transmissive substrate, and has an upper surface opposite to the first surface, and a side wall interconnecting the upper surface and the first surface. The first insulation layer covers the side wall and the upper surface of the epitaxial structure. The second insulation layer covers a portion of the first surface of the light-transmissive substrate that is not covered by the epitaxial structure and the first insulation layer. The second insulation layer has a light transmittance greater than that of the first insulation layer.

According to the disclosure, the light-emitting diode package includes a package substrate, and at least one light-emitting diode as mentioned above which is disposed on the package substrate.

According to the disclosure, the light-emitting diode module includes a package substrate, and a light-emitting array which is disposed on the package substrate and which includes a plurality of light-emitting diodes that are arranged in a matrix. At least one of the light-emitting diodes is the light-emitting diode as mentioned above.

According to the disclosure, the display device includes a plurality of light-emitting diode modules as mentioned above.

BRIEF DESCRIPTION OF THE DRAWINGS

Other features and advantages of the disclosure will become apparent in the following detailed description of the embodiments with reference to the accompanying drawings, in which.

DETAILED DESCRIPTION

Figure 1:
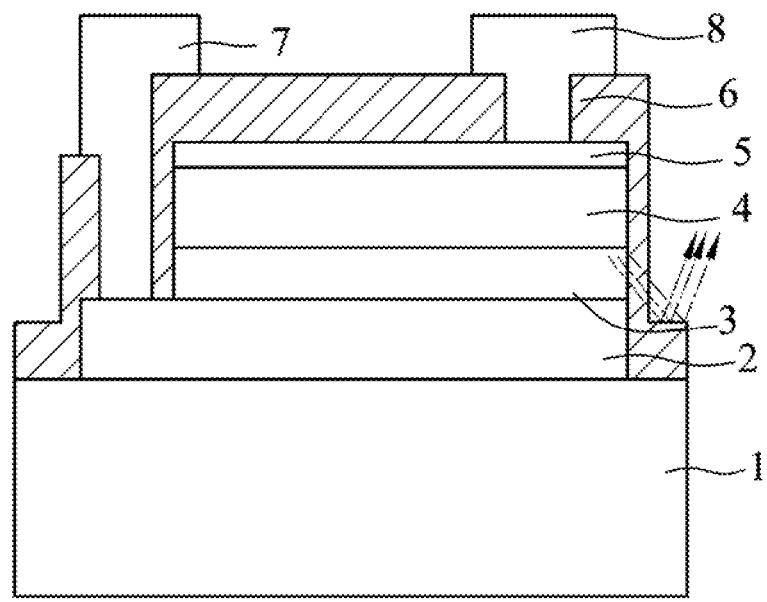
FIG. 1 is a schematic view illustrating a conventional flip-chip light-emitting diode (LED)
Figure 2:
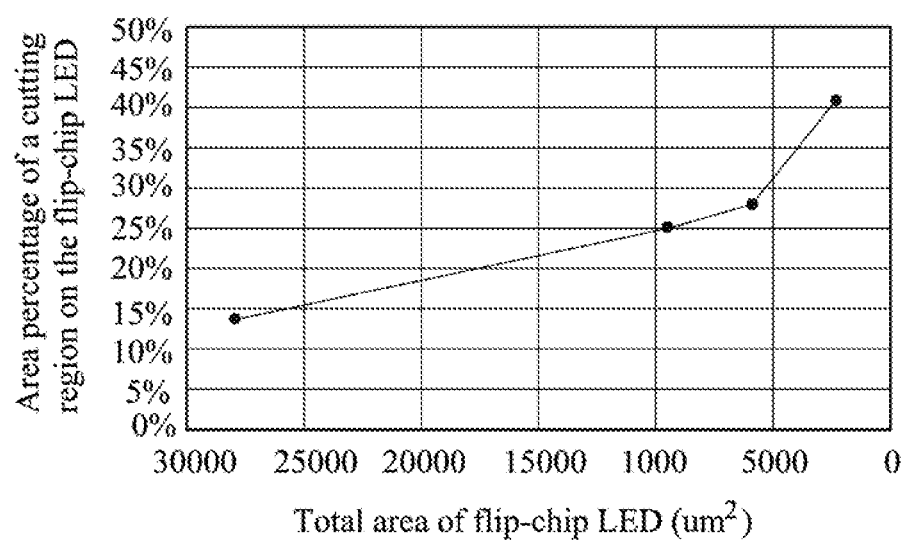
FIG. 2 is a diagram illustrating a relationship between a total area of the conventional flip-chip LED and an area percentage of a cutting region on the conventional flip-chip LED.

Before the disclosure is described in greater detail, it should be noted that where considered appropriate, reference numerals have been repeated among the figures to indicate corresponding or analogous elements, which may optionally have similar characteristics.

Figure 3:
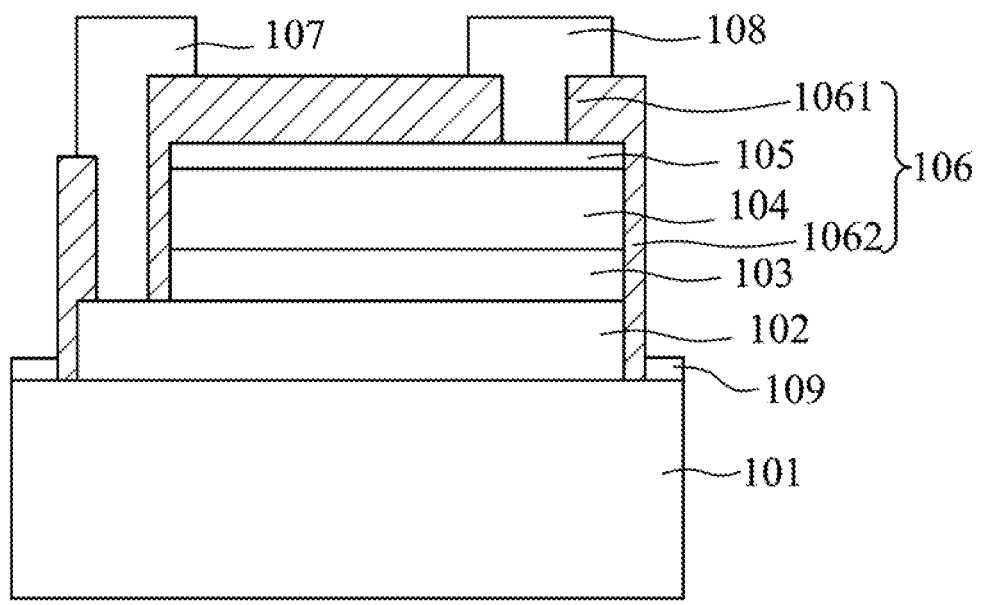
FIG. 3 is a schematic view illustrating a first embodiment of an LED according to the disclosure.

Referring to FIG. 3, a first embodiment of a light-emitting diode (LED) according to the disclosure includes a light-transmissive substrate 101, an epitaxial structure, a first insulation layer 106, and a second insulation layer 109.

The light-transmissive substrate 101 may be electrically insulating or electrically conductive based on practical requirements. In certain embodiments, the light-transmissive substrate 101 may be a growth substrate for growing the epitaxial structure. Such growth substrate may be made of materials such as sapphire, silicon carbide, silicon, gallium nitride, aluminum nitride, etc. The light-transmissive substrate 101 has a first surface, a second surface opposite to the first surface, and a side wall interconnecting the first and second surfaces. The second surface is the major light exiting surface of the LED. In certain embodiments, at least a portion of the first surface of the light-transmissive substrate 101 is formed with a protrusion pattern, which may be irregular or regular. For example, the light-transmissive substrate 101 may be a patterned sapphire substrate. A thickness of the light-transmissive substrate 101 may be within a range of 40 μm to 150 μm. For example, when the light-transmissive substrate 101 is relatively thick, the thickness thereof may be within a range of 80 μm to 150 μm. When the light-transmissive substrate 101 is relatively thin, the thickness thereof may be within a range of 40 μm to 80 μm, or even within a range of 40 μm to 60 μm.

A size of the LED may be controlled by a size of the first surface of the light-transmissive substrate 101, so as to meet miniaturization requirements of LEDs for applications in various electronic devices. In certain embodiments, the first surface of the light-transmissive substrate 101 has a length that ranges from 40 μm to 300 μm, such as 100 μm to 300 μm, 100 μm to 200 μm, or even not greater than 100 μm (e.g., 40 μm to 100 μm). An area of the first surface (i.e., an area of a horizontal cross-section of the light-transmissive substrate 101) may be equal to or lower than 90000 μm$^2$ (such as 10000 μm$^2$ to 50000 μm), or even equal to or lower than 10000 μm$^2$, and greater than 2000 μm (e.g., 50 μm×50 μm).

The epitaxial structure is disposed on the first surface of the light-transmissive substrate 101. At least a portion of the first surface of the light-transmissive substrate 101 is covered by the epitaxial structure. A remaining portion of the first surface that is not covered by the epitaxial structure serves as a cutting region for a cutting process to be conducted. The epitaxial structure may be surrounded by the cutting region. The epitaxial structure has an upper surface opposite to the first surface, and a side wall interconnecting the upper surface and the first surface.

The epitaxial structure includes a first-type semiconductor layer 102, an active layer 103, and a second-type semiconductor layer 104 that are sequentially disposed on the first surface of the light-transmissive substrate 101 in such order. Each of the first-type semiconductor layer 102, the active layer 103, and the second-type semiconductor layer 104 may be made of a group III-IV nitride semiconductor material such as a nitride-based semiconductor material. Examples of the nitride-based semiconductor material may include, but are not limited to, AlN, GaN, InN, and combinations thereof. The first-type semiconductor layer 102 includes one of an N-type dopant (e.g., Si, Ge, and Sn) and a P-type dopant (e.g., Mg, Sr, and Ba), and the second-type semiconductor layer 104 includes the other one of the N-type dopant and P-type dopant. In this embodiment, the first-type semiconductor layer 102 includes the N-type dopant, and the second-type semiconductor layer 104 includes the P-type dopant. The active layer 103 may include a multiple quantum well structure, and may be made of a predetermined nitride-based material based on a desired wavelength of light to be emitted therefrom.

The epitaxial structure may include at least one recess which extends through the second semiconductor layer 104 and the active layer 103, and which terminates at the first semiconductor layer 102. That is, the recess partially exposes the first semiconductor layer 102, and is defined by side walls of the second semiconductor layer 104 and the active layer 103, and an exposed surface of the first semiconductor layer 102. Alternatively, the epitaxial structure may be formed with at least one mesa structure such that a portion of the first semiconductor layer 102 is not covered by the active layer 103 or the second semiconductor layer 104. In this embodiment, as shown in FIG. 3, the epitaxial structure is formed with one mesa structure.

The first insulation layer 106 covers the side wall and the upper surface of the epitaxial structure. The first insulation layer 106 includes an upper covering part 1061 and a side covering part 1062 which respectively cover the upper surface and the side wall of the epitaxial structure. The first insulation layer 106 may also cover a portion of the first semiconductor layer 102 exposed from the mesa structure of the epitaxial structure. As such, the light emitted from the active layer 103, when reaching the first insulation layer 106, may be reflected back into the epitaxial structure by the first insulation layer 106, and then may exit from the second surface of the light-transmissive substrate 101, thereby reducing loss of light exiting from the upper surface and/or the side wall of the epitaxial structure.

The upper covering part 1061 of the first insulation layer 106 may have a geometric thickness represented by a formula of $2k\lambda/4n$, where k is a positive integer, $\lambda$ is a wavelength of light emitted from the active layer 103 of the epitaxial structure, and n is a refractive index of the first insulation layer 106. A geometric thickness of the upper covering part 1061 along a direction perpendicular to the upper surface may be different from a geometric thickness of the side covering part 1062 along a direction perpendicular to the side wall of the epitaxial structure. In certain embodiments, the thickness of the side covering part 1062 is 40% to 90% of the thickness of the upper covering part 1061.

The first insulation layer 106 may include a distributed Bragg reflector structure which contains multiple pairs of layers, each pair including a first layer having a first refractive index and a second layer having a second refractive index lower than the first refractive index. The first layers and the second layers in the distributed Bragg reflector structure are alternately stacked. In certain embodiments, each of the first layers is made of a material selected from the group consisting of $TiO_2$ and $Ti_2O_5$, and each of the second layers is made of a material selected from the group consisting of an oxide of silicon ($SiO_x$) and a fluoride of magnesium ($MgF_x$). For example, the distributed Bragg reflector structure includes alternately stacked $TiO_2$ and $SiO_2$ layers. Theoretically, in order to reflect 80% or even 90% of the light emitted from the active layer 103, each of the first and second layers in the distributed Bragg reflector structure of the first insulation layer 106 may have an optical thickness that is equal to an integer multiple of one-quarter of an emission peak wavelength of the light emitted from the active layer 103 (i.e., $\lambda/4$). The distributed Bragg reflector structure of the first insulation layer 106 may include 4 to 20 pairs of the first and second layers. In addition, in certain embodiments, an uppermost portion of the first insulation layer 106 may be made of a nitride of silicon ($SiN_x$), so as to protect the LED from moisture.

The second insulation layer 109 covers a portion of the first surface (i.e., the cutting region) of the light-transmissive substrate 101 that is not covered by the epitaxial structure and the first insulation layer 106. The second insulation layer 109 has a light-transmittance greater than that of the first insulation layer 106. In certain embodiments, the second insulation layer 109 has a light transmittance that is at least 90%. The light emitted from the epitaxial structure, when passing through the side wall of the epitaxial structure, may reach and pass through the second insulation layer 109 located at the cutting region of the LED and then may exit from the second surface of the light-transmissive substrate 101, so as to effectively reduce light loss at the cutting region, thereby increasing a light extraction efficiency of the LED.

In this embodiment, the second insulation layer 109 is made of a material different from that of the first insulation layer 106. The second insulation layer 109 may have a single-layer structure. For example, the second insulation layer 109 may be made of a material selected from the group consisting of an oxide of silicon ($SiO_x$), a nitride of silicon ($SiN_x$), magnesium fluoride, and $Al_2O_3$. The second insulation layer 109 may have a geometric thickness represented by a formula of $(2k-1)\lambda/4n$, where k is a positive integer, $\lambda$ is a wavelength of light emitted from the epitaxial structure, and n is a refractive index of the second insulation layer 109. For example, when the second insulation layer 109 is made of $SiO_2$ having a refractive index n of 1.46, a wavelength of light emitted from the epitaxial structure is within a range of 440 nm to 480 nm, and k=1, the geometric thickness of the second insulation layer 109 may be estimated to be within a range of 75 nm to 82 nm.

The epitaxial structure may further include a contact electrode 105 which is disposed between the second-type semiconductor layer 104 and the first insulation layer 106, and which is capable of forming an ohmic contact with the second-type semiconductor layer 104. The contact electrode 105 may be a light-transmissive electrode made of one of an electrically conductive oxide, a metallic material (e.g., Ni or Au), and a combination thereof. The electrically conductive oxide may be further doped with dopants. Examples of the electrically conductive oxide may include, but are not limited to, indium tin oxide (ITO), zinc oxide (ZnO), indium-tin-zinc oxide, indium zinc oxide, tin-zinc oxide, indium-gallium-tin oxide, indium-gallium oxide, gallium-zinc oxide, aluminum-doped zinc oxide, and fluorine-doped tin oxide. When the contact electrode 105 is made of the electrically conductive oxide, a relatively high efficiency of ohmic contact between the contact electrode 105 and the second-type semiconductor layer 104 may be achieved. For example, a contact resistance between the second-type semiconductor layer 104 and the contact electrode 105 made of ITO or ZnO is lower than a contact resistance between the second-type semiconductor layer 104 and the contact electrode 105 made of the metallic material. Therefore, the contact electrode 105 made of the electrically conductive oxide is capable of decreasing a forward voltage (Vf) of the LED, thereby increasing the light extraction efficiency thereof. In addition, as compared to the contact electrode 105 made of the metallic material, the contact electrode 105 made of the electrically conductive oxide is less prone to peeling, and therefore the resultant LED may have a higher reliability.

The LED may further include a first electrode 107 and a second electrode 108. The first insulation layer 106 may be formed with a first hole to expose the first-type semiconductor layer 102, and a second hole to expose the upper surface of the epitaxial structure. The first electrode 107 is formed in the first hole and is electrically connected to the first-type semiconductor layer 102. The second electrode 108 is formed in the second hole and is electrically connected to the second-type semiconductor layer 104. In this embodiment, the second hole exposes the contact electrode 105, and the second electrode 108 is electrically connected to the second-type semiconductor layer 104 through the contact electrode 105. Each of the first and second electrodes 107, 108 may include a metallic contact layer and a metallic eutectic layer. A minimal horizontal distance between the first and second electrodes 107, 108 on the first insulation layer 106 may be 5 μm. In certain embodiments, the contact electrode 105 may be formed with a through hole to expose the second-type semiconductor layer 104, and the second electrode 108 may extend into the through hole to contact with the second-type semiconductor layer 104. A resistance between the second electrode 108 and the second-type semiconductor layer 104 may be higher than a resistance between the second electrode 108 and the contact electrode 105, so as to reduce a current crowding effect at an interface between the second electrode 108 and the second-type semiconductor layer 104.

Figure 4:
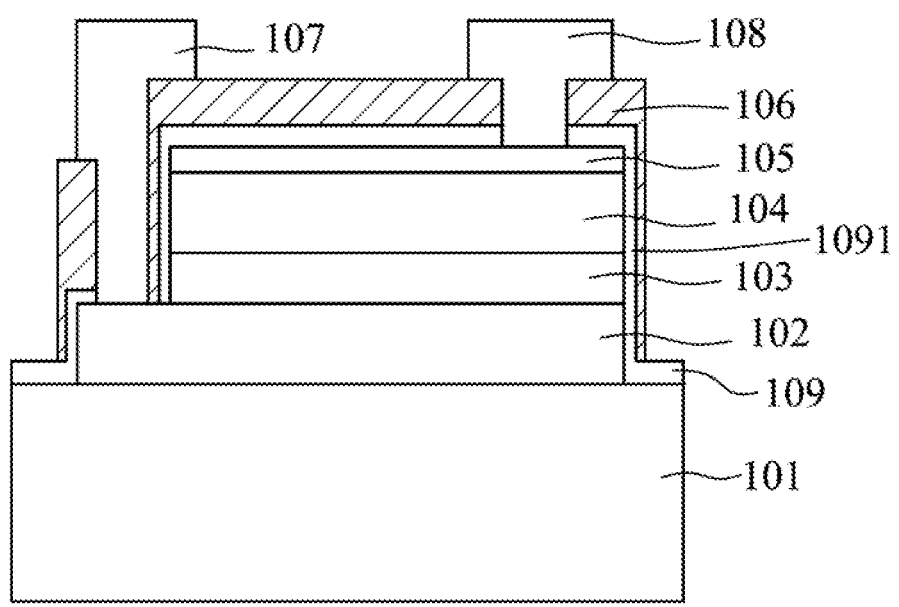
FIG. 4 is a schematic view illustrating a second embodiment of the LED according to the disclosure.

Referring to FIG. 4, a second embodiment of the LED according to the disclosure is similar to the first embodiment, except that in the second embodiment, the second insulation layer 109 further includes an extension covering part 1091 which covers the upper surface and the side wall of the epitaxial structure, and which is disposed between the epitaxial structure and the first insulation layer 106.

In the second embodiment, the first insulation layer 106 containing a distributed Bragg reflector structure may further include an interface layer (not shown in the figures) to improve a quality of the distributed Bragg reflector structure. The interface layer may be made of $SiO_2$, and may have a thickness within a range of 0.2 µm to 1.0 µm. When the first insulation layer 106 includes alternately stacked $TiO_2$/$SiO_2$ layers (i.e., the distributed Bragg reflector structure) which are deposited on the interface layer, such interface layer may directly serve as the second insulation layer 109. With the second insulation layer 109 (i.e., the interface layer) disposed on the cutting region, the light extraction efficiency of the LED may be improved, and a compressive strain at the cutting region may be reduced, thereby reducing bowing of the LED and improving a quality thereof.

Figure 5:
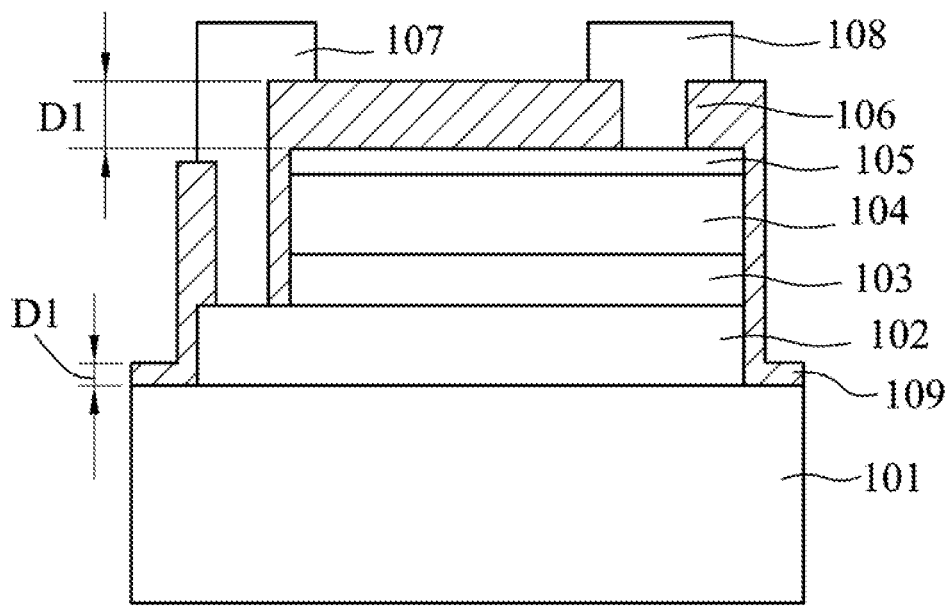
FIG. 5 is a schematic view illustrating a third embodiment of the LED according to the disclosure.

Referring to FIG. 5, a third embodiment of the LED according to the disclosure is similar to the first embodiment except that, in the third embodiment, the first and second insulation layers 106, 109 are made of an identical material. Each of the first and second insulation layers 106, 109 is made of a material selected from the group consisting of an oxide of silicon ($SiO_x$), a nitride of silicon ($SiN_x$), magnesium fluoride, and $Al_2O_3$. Each of the first and second insulation layers 106, 109 has a refractive index lower than those of the first-type semiconductor layer 102, the active layer 103 and the second-type semiconductor layer 104.

The thickness of the first insulation layer 106 is not limited specifically, and may be modified based on practical requirements. In this embodiment, the first insulation layer 106 has a thickness (D1) that is greater than a thickness (D2) of the second insulation layer 109. The second insulation layer 109 may be obtained by a thinning process (i.e., thinning a portion of the first insulation layer 106 which is originally disposed on the cutting region). When the LED has a thickness of not greater than 80 µm, the geometric thickness of the second insulation layer 109 (i.e., D2) is not greater than 50 nm, so as to effectively release compressive strain at the cutting region of the LED.

In this embodiment, the first insulation layer 106 has a geometric thickness represented by the formula of $2k\lambda/4n$, and the second insulation layer 109 has a geometric thickness represented by the formula of $(2k-1)\lambda/4n$, where k is a positive integer, $\lambda$ is a wavelength of light emitted from the epitaxial structure, and n is a refractive index of the material for making the first and second insulation layers 106, 109. Specifically, when the first and second insulation layers 106, 109 are made of $SiO_2$ having a refractive index of 1.46, a wavelength of light emitted from the epitaxial structure is within a range of 440 nm to 480 nm, and k=1, the geometric thickness of the first insulation layer 106 (i.e., D1) is within a range of 150 nm to 165 nm, and the geometric thickness of the second insulation layer 109 (i.e., D2) is within a range of 75 nm to 82 nm.

Figure 6:
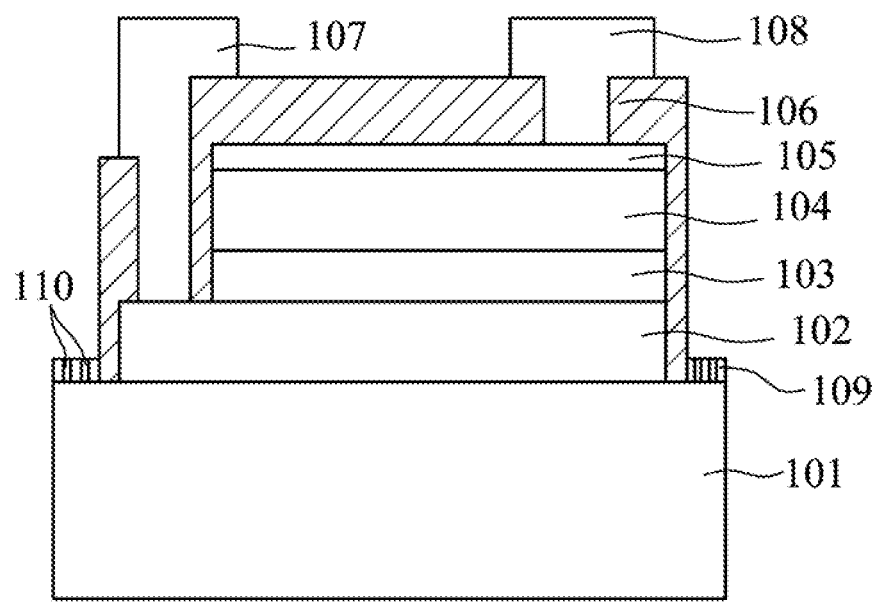
FIG. 6 is a schematic view illustrating a fourth embodiment of the LED according to the disclosure.

Referring to FIG. 6, a fourth embodiment of the LED according to the disclosure is similar to the first embodiment except that, in the fourth embodiment, the second insulation layer 109 is formed with at least one opening 110. The opening 110 may be formed in a loop shape, a strip shape, or a pinhole shape. When the opening 110 is formed in a strip shape, a width thereof may range from 2 µm to 10 µm. When the opening 110 is formed in a loop shape or a pinhole shape, a diameter thereof may range from 2 µm to 10 µm. When the second insulation layer 109 is formed with a plurality of the openings 110, a distance between two adjacent ones of the openings 110 may range from 2 µm to 5 µm.

By formation of the opening(s) 110 in the second insulation layer 109, the light emitted from the side wall of the epitaxial structure may directly pass through the second insulation layer 109 at the cutting region of the LED through the openings 110, which may increase the light extraction efficiency of the LED. In addition, the openings 110 are also capable of reducing the compressive strain at the cutting region, thereby reducing bowing and breakage of the LED.

It should be noted that the second insulation layer 109 of the second or third embodiment of the LED may also be formed with the opening(s) 110, so as to increase the light extraction efficiency of the LED.

Referring to FIGS. 7 to 15, a method for manufacturing one of the first to third embodiments of the LEDs according to the disclosure includes the following steps.

Figure 7:
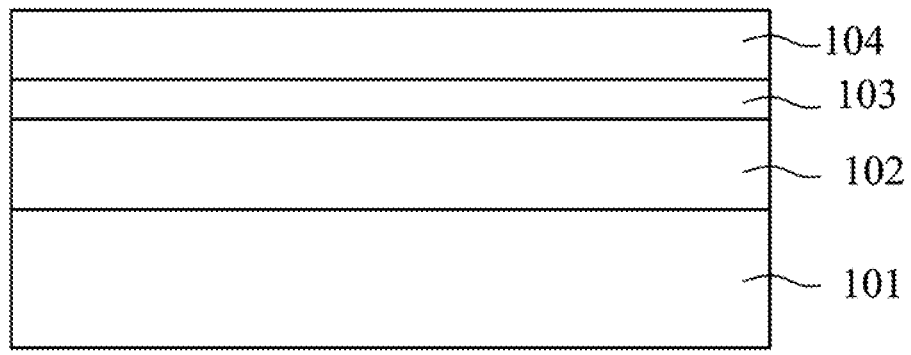
FIGS. 7 to 15 are schematic views illustrating consecutive steps of a method for manufacturing each of the first to third embodiments according to the disclosure.

As shown in FIG. 7, the epitaxial structure is provided on the light-transmissive substrate 101. The epitaxial structure includes the first-type semiconductor layer 102, the active layer 103, and the second-type semiconductor layer 104 that are formed on the light-transmissive substrate 101 in such order.

Figure 8:
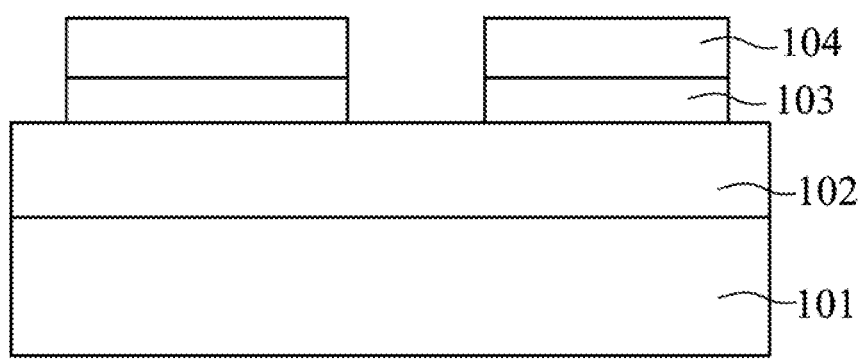
Figure 9:
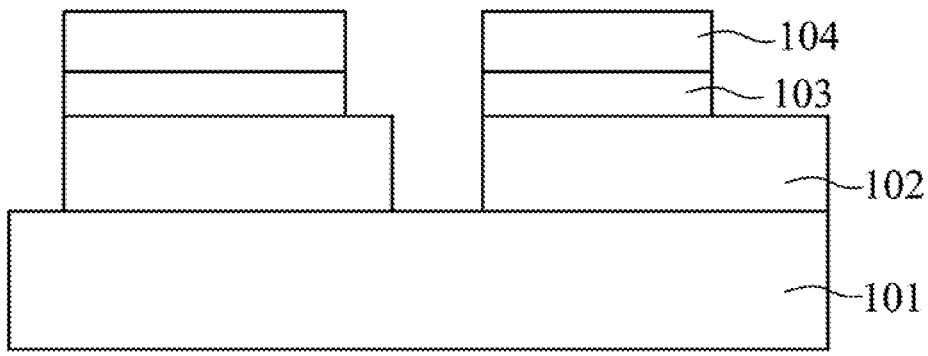

As shown in FIG. 8, the epitaxial structure is etched using a photomask to form a plurality of the recesses each extending through the second-type semiconductor layer 104 and the active layer 103 and partially exposing the first-type semiconductor layer 102. As shown in FIG. 9, the first-type semiconductor layer 102 exposed from the recesses is further etched using a photomask to partially expose the first surface of the light-transmissive substrate 101 (i.e., the cutting region), thereby forming a plurality of LED units separated by the cutting region, each having a mesa structure.

Figure 10:
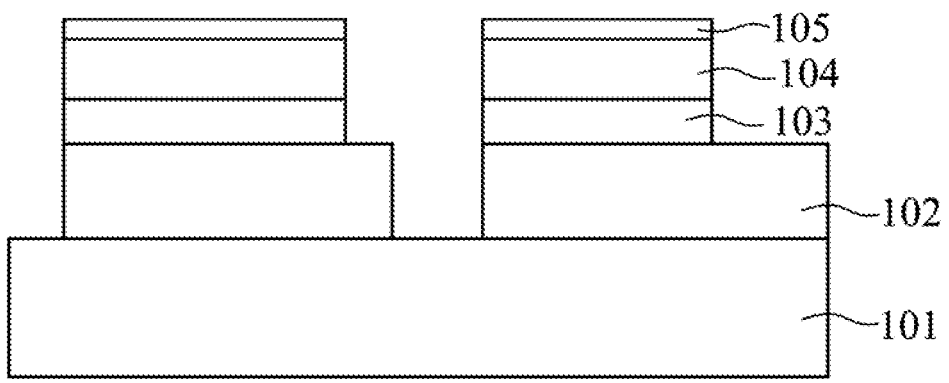

As shown in FIG. 10, for each of the LED units, the contact electrode 105 (e.g., made of ITO) is formed on the second-type semiconductor layer 104 opposite to the active layer 103 by a vapor deposition process or a sputtering process. In certain embodiments, the contact electrode 105 may be formed with at least one electrode hole to partially expose the second-type semiconductor layer 104.

Figure 11:
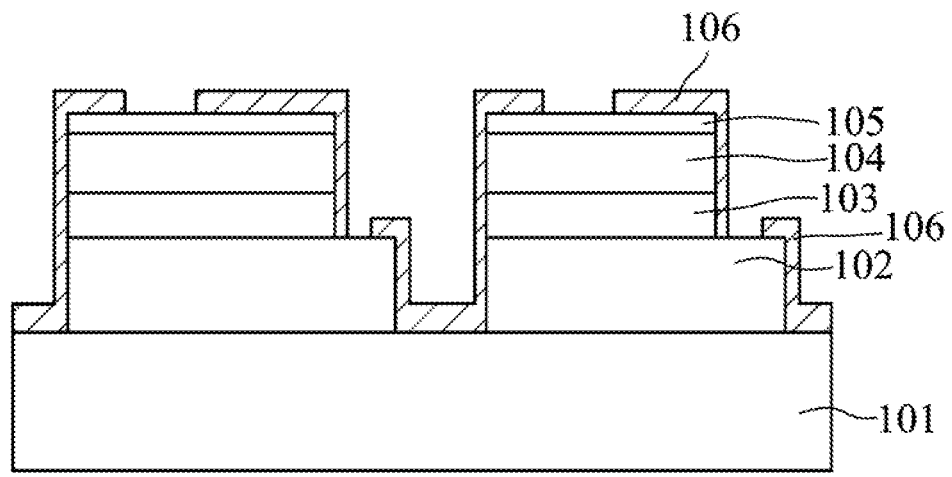

As shown in FIG. 11, for each of the LED units, the first insulation layer 106 is formed by a vapor deposition process or a sputtering process to cover the upper surface of the epitaxial structure (i.e., the contact electrode 105), the side wall of the epitaxial structure, and the exposed first surface of the light-transmissive substrate 101. The first insulation layer 106 is formed with the first hole and the second hole. The first hole partially exposes the first-type semiconductor layer 102, and the second hole partially exposes the contact electrode 105.

Figure 12:
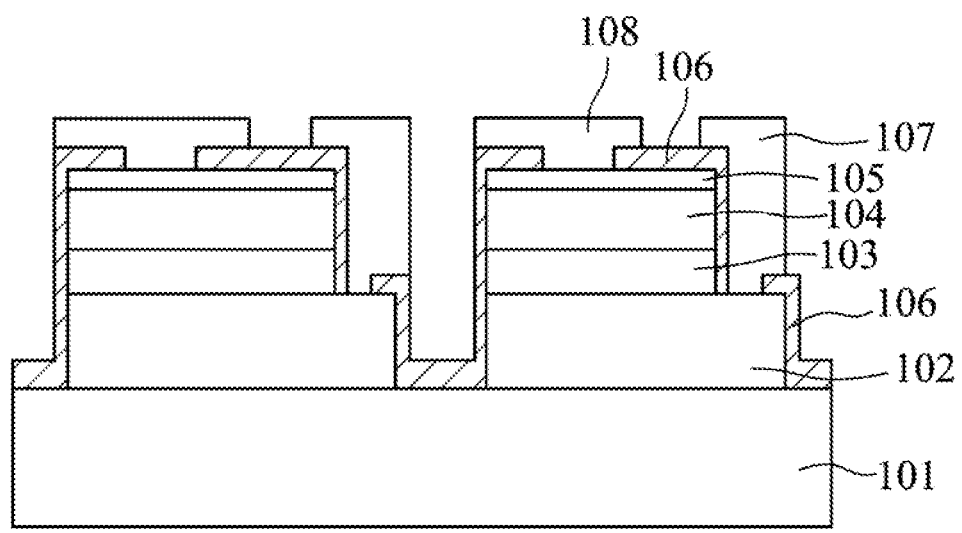

As shown in FIG. 12, for each of the LED units, the first and second electrodes 107, 108 are respectively formed in the first and second holes, such that the first electrode 107 is electrically connected to the first-type semiconductor layer 102, and the second electrode 108 is electrically connected to the second-type semiconductor layer 104 through the contact electrode 105. In certain embodiments, when the contact electrode 105 is formed with the electrode hole, the second electrode 108 can directly contact with the second-type semiconductor layer 104 via the electrode hole of the contact electrode 105.

Figure 13:
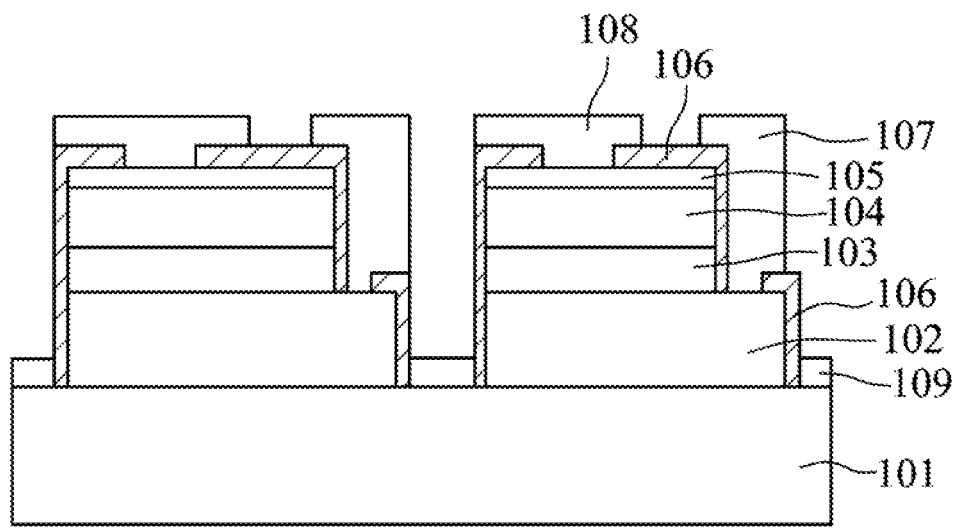
Figure 14:
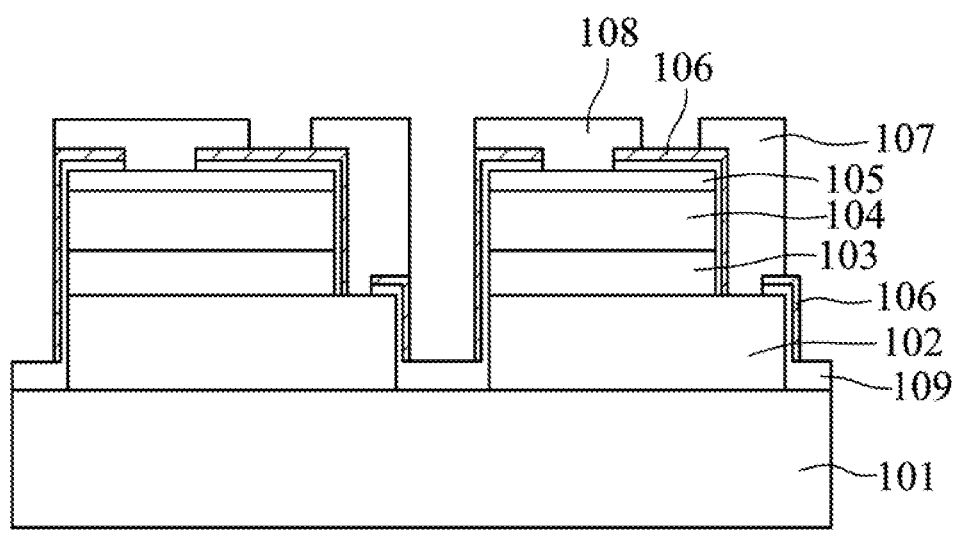
Figure 15:
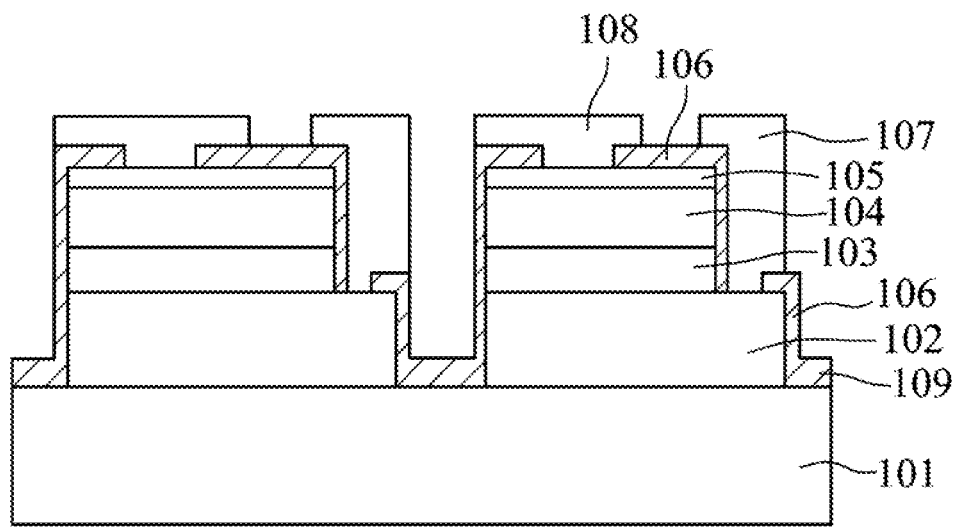

Referring to FIGS. 13 to 15, for each of the LED units, the second insulation layer 109 is formed at the cutting region. To be specific, for making the first embodiment of the LED, a portion of the first insulation layer 106 disposed on the cutting region is entirely removed to expose the first surface of the light-transmissive substrate 101, and then the second insulation layer 109 made of a material different from that of the first insulation layer 106 is formed on the exposed portion of the light-transmissive substrate 101 (see FIG. 13).

As shown in FIG. 14, for making the second embodiment of the LED, a portion of the distributed Bragg reflector structure (alternately stacked $TiO_2$/$SiO_2$ layers) of the first insulation layer 106 that is located at the cutting region is partially removed, such that the interface layer made of $SiO_2$ (not shown) remains on the cutting region and serves as the second insulation layer 109. The interface layer may be further thinned to have a thickness that exhibits a desired light transmittance. Alternatively, a portion of the first insulation layer 106 disposed on the cutting region may be entirely removed to expose the first surface of the light-transmissive substrate 101, and then the second insulation layer 109 is formed on the exposed first surface of the light-transmissive substrate 101.

As shown in FIG. 15, for making the third embodiment of the LED, a portion of the first insulation layer 106 disposed on the cutting region is thinned to meet requirements for light transmittance, so as to obtain the second insulation layer 109. That is, the second insulation layer 109 is made of a material identical to that of the first insulation layer 106, and has a thickness smaller than that of the first insulation layer 106.

Finally, a cutting process is performed on the cutting region, so as to separate the LED units from one another, thereby obtaining a plurality of the LEDs of this disclosure. The cutting process may be conducted by a laser scanning procedure to form a plurality of explosion points in the light-transmissive substrate 101 underneath the cutting region, followed by dicing along the cutting region using an LED wafer breaker to excite the explosion points, thereby obtaining the separated LEDs.

Figure 16:
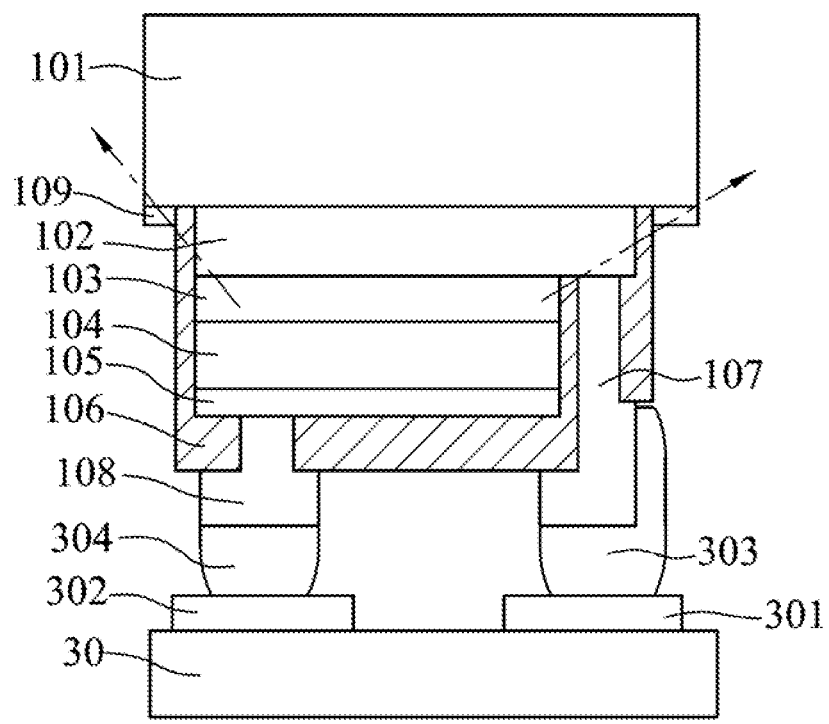
FIG. 16 is a schematic view illustrating an LED package including the LED of the disclosure.
Figure 17:
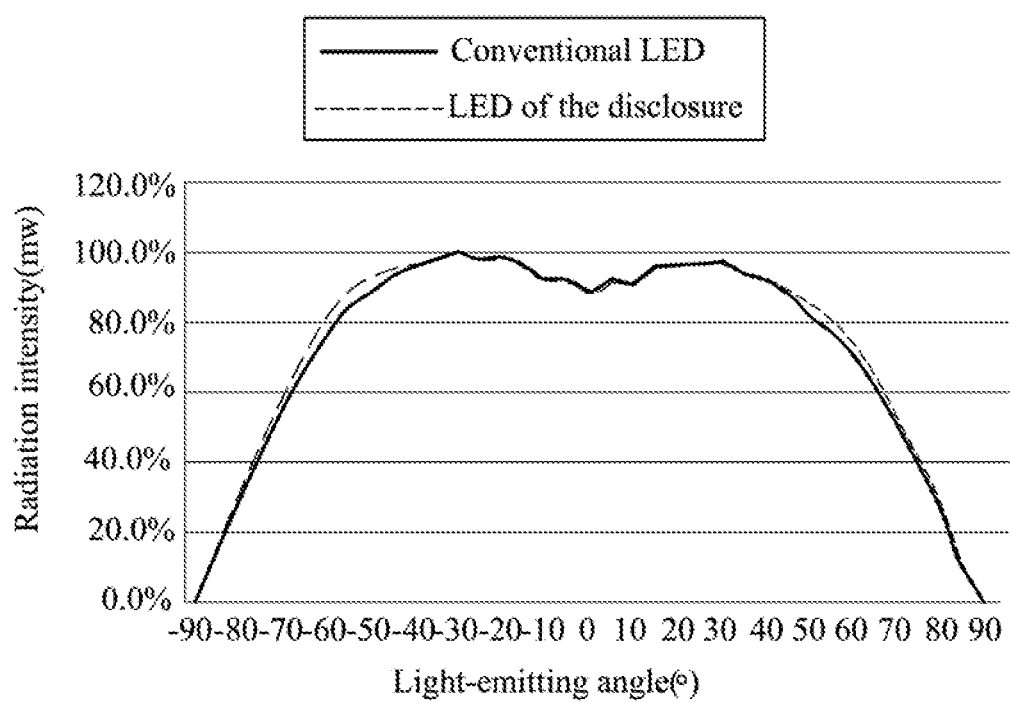
FIG. 17 is a diagram illustrating relationship of radiation intensity and light emitting angle of the conventional LED and that of the LED of the disclosure.

The LED of the disclosure, which has a relatively high luminance, can be widely applied in various fields such as backlight display device and semiconductor packaging. For example, referring to FIG. 16, an LED package according to the disclosure includes a package substrate 30, and at least one LED of the disclosure which is disposed on the package substrate 30. The package substrate 30 may be an electrically insulating substrate, such as a substrate commonly used in RGB display screens or backlight display devices. A first electrode layer 301 and a second electrode layer 302 are spacedly formed on the package substrate 30 in a manner such that the first and second electrode layers 301, 302 are electrically isolated from each other. The first and second electrode layers 301, 302 of the LED package are respectively electrically connected to the first electrode 107 of the LED via a first connecting member 303, and to the second electrode 108 of the LED via a second connecting member 304. Each of the first and second connecting members 303, 304 may be made of a solder material such as eutectic solder and reflow solder, but is not limited thereto. It can be noted that, the light emitted from the active layer 103 (illustrated as arrow lines in FIG. 16) can pass through the first insulation layer 106 and the second insulation layer 109 to exit therefrom without undergoing secondary reflection. Referring to FIG. 17, the LED of the disclosure exhibits a higher intensity of light emitted at a relatively high light-emitting angle as compared to that of the conventional LED as shown in FIG. 1.

When used in RGB display or backlight modules, a plurality of LEDs are generally arranged in a matrix to form a light-emitting array. Therefore, the disclosure also provides an LED module which includes the package substrate 30 and the light-emitting array disposed on the package substrate 30. The matrix of the light-emitting array may include at least one column of red LEDs, at least one column of green LEDs, and at least one column of blue LEDs. Alternatively, all of the LEDs of the light-emitting array may be the same LEDs (e.g., blue LEDs).

According to this disclosure, a display device (e.g., liquid-crystal display (LCD) display device) including a plurality of the abovementioned LED modules is provided such that high-dynamic range (HDR) images achieve satisfactory display effects. A contrast ratio of the display device can be controlled by turning on or off a specific one of the LEDs in the LED modules. In addition, since the LED of this disclosure exhibits an increased luminance, a total luminance of the display device may be further improved.

Figure 18:
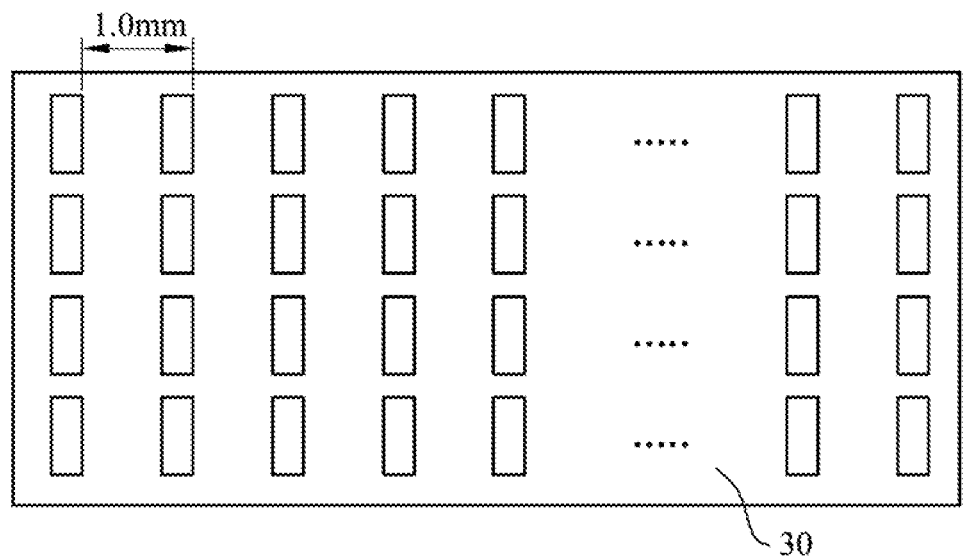
FIG. 18 is a schematic view illustrating an LED module including conventional LEDs, in which two adjacent ones of the conventional LEDs are spaced apart from one another by a distance of 1.0 mm.
Figure 19:
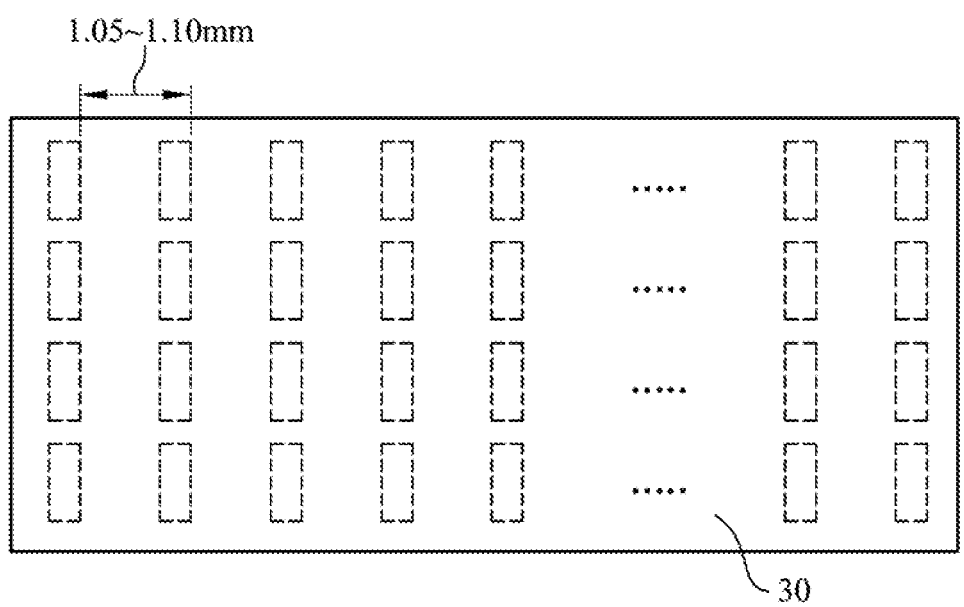
FIG. 19 is a schematic view illustrating an LED module including the LED of the disclosure, in which two adjacent ones of the LEDs of the disclosure are spaced apart from one another by a distance within a range of 1.05 mm to 1.10 mm.

Referring to FIG. 18, when the LED module includes the conventional LEDs of FIG. 1, two adjacent ones of the conventional LEDs are spaced apart from one another by a distance of e.g., 1.0 mm, so as to compensate for light loss at the cutting region of the LEDs and maintain a total luminance of the LED module. In comparison, as shown in FIG. 19, since the LED module includes the LEDs of the disclosure which exhibit a higher light extraction efficiency, two adjacent ones of the LEDs may be spaced apart by each other by a larger distance, such as 5% to 10% greater than that of the conventional LEDs (i.e., 1.05 nm to 1.10 nm), so that the LED module of FIG. 19 achieves the same total luminance as that of the conventional LED module of FIG. 18. In other words, the number of LEDs required in the LED module of FIG. 19 may be reduced by 5% to 10% compared to that of the LED module of FIG. 18, thereby lowering a manufacture cost thereof.

In sum, by virtue of the second insulation layer 109 which is formed on the cutting region of the LED, and which has a light transmittance greater than that of the first insulation layer 106, secondary light reflection by the second insulation layer 109 at the cutting region may be reduced, and the light extraction efficiency of the LED of this disclosure may be increased. In addition, by formation of the opening(s) 110 in the second insulation layer 109, the light extraction efficiency and luminance of the LED of this disclosure may be further improved. Furthermore, by controlling the thickness of the second insulation layer 109 to be smaller than that of the first insulation layer 106 and/or forming the opening(s) 110 in the second insulation layer 109, the compressive strain at the cutting region of the LED may be reduced, thereby reducing bowing of the LED of this disclosure and improving the quality thereof.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting diode, comprising:
    a light-transmissive substrate which has a first surface;
    an epitaxial structure which is disposed on said first surface of said light-transmissive substrate, and which has an upper surface opposite to said first surface, and a side wall interconnecting said upper surface and said first surface;
    a first insulation layer which covers said side wall and said upper surface of said epitaxial structure; and
    a second insulation layer which covers a portion of said first surface of said light-transmissive substrate that is exposed from said epitaxial structure and said first insulation layer, said second insulation layer having a light transmittance greater than that of said first insulation layer, and being formed with at least one opening exposing said first surface.

2. The light-emitting diode according to claim 1, wherein said first and second insulation layers are made of an identical material, and said first insulation layer has a thickness that is greater than a thickness of said second insulation layer.

3. The light-emitting diode according to claim 2, wherein the thickness of said second insulation layer is not greater than 50 nm.

4. The light-emitting diode according to claim 2, wherein each of said first and second insulation layers is made of a material selected from the group consisting of an oxide of silicon, a nitride of silicon, magnesium fluoride, and $Al_2O_3$.

5. The light-emitting diode according to claim 1, wherein said first insulation layer includes an upper covering part and a side covering part which respectively cover said upper surface and said side wall of said epitaxial structure, said upper covering part has a geometric thickness represented by a formula of $2k\lambda/4n$, where k is a positive integer, $\lambda$ is a wavelength of light emitted from said epitaxial structure, and n is a refractive index of said first insulation layer.

6. The light-emitting diode according to claim 1, wherein said second insulation layer has a geometric thickness represented by a formula of $(2k-1)\lambda/4n$, where k is a positive integer, $\lambda$ is a wavelength of light emitted from said epitaxial structure, and n is a refractive index of said second insulation layer.

7. The light-emitting diode according to claim 1, wherein said first and second insulation layers are made of different materials.

8. The light-emitting diode according to claim 7, wherein said first insulation layer is a distributed Bragg reflector structure which includes multiple pairs of layers, each pair including a first layer having a first refractive index and a second layer having a second refractive index lower than the first refractive index, said first layers and said second layers in the distributed Bragg reflector structure being alternately-stacked.

9. The light-emitting diode according to claim 8, wherein each of said first layers is made of a material selected from the group consisting of $TiO_2$ and $Ti_2O_5$, and each of said second layers is made of a material selected from the group consisting of an oxide of silicon and a fluoride of magnesium.

10. The light-emitting diode according to claim 7, wherein said second insulation layer is made of a material selected from the group consisting of an oxide of silicon, a nitride of silicon, magnesium fluoride, and $Al_2O_3$.

11. The light-emitting diode according to claim 7, wherein said second insulation layer has a single-layer structure.

12. The light-emitting diode according to claim 7, wherein said second insulation layer further includes an extension covering part which covers said upper surface and said side wall of said epitaxial structure, and which is disposed between said epitaxial structure and said first insulation layer.

13. The light-emitting diode according to claim 1, wherein said first insulation layer includes an upper covering part and a side covering part which covers said upper surface and said side wall of said epitaxial structure, and a geometric thickness of said upper covering part along a direction perpendicular to said upper surface is different from a geometric thickness of said side covering part along a direction perpendicular to said side wall.

14. The light-emitting diode according to claim 13, wherein the thickness of said side covering part is 40% to 90% of the thickness of said upper covering part.

15. The light-emitting diode according to claim 1, wherein said first surface of said light-transmissive substrate has a length that ranges from 40 µm to 300 µm.

16. The light-emitting diode according to claim 1, wherein:
    said epitaxial structure includes a first-type semiconductor layer, an active layer, and a second-type semiconductor layer that are sequentially disposed on said first surface of said light-transmissive substrate in such order;
    said first insulation layer is formed with a first hole to expose said first-type semiconductor layer, and a second hole to expose said upper surface; and
    said light-emitting diode further comprises a first electrode and a second electrode, said first electrode being formed in said first hole and being electrically connected to said first-type semiconductor layer, said second electrode being formed in said second hole and being electrically connected to said second-type semiconductor layer.

17. The light-emitting diode according to claim 16, wherein said epitaxial structure further includes a contact electrode which is disposed between said second-type semiconductor layer and said first insulation layer.

18. The light-emitting diode according to claim 1, wherein said opening is formed in one of a loop shape, a strip shape, and a pinhole shape.

19. The light-emitting diode according to claim 1, wherein said opening has a diameter ranging from 2 µm to 10 µm.

20. The light-emitting diode according to claim 1, wherein said second insulation layer is formed with a plurality of the openings, a distance between two adjacent ones of said openings ranging from 2 µm to 5 µm.

21. A light-emitting diode package, comprising:
    a package substrate; and
    at least one light-emitting diode as claimed in claim 1, which is disposed on said package substrate.

22. A light-emitting diode module, comprising:
    a package substrate; and a light-emitting array which is disposed on said package substrate and which includes a plurality of light-emitting diodes that are arranged in a matrix, at least one of said light-emitting diodes being the light-emitting diode as claimed in claim 1.

23. The light-emitting diode module according to claim 22, wherein said matrix includes at least one column of red light-emitting diodes, at least one column of green light-emitting diodes, and at least one column of blue light-emitting diodes.

24. The light-emitting diode according to claim 22, wherein said light-emitting diodes are blue light-emitting diodes.

25. A display device, comprising:
a plurality of light-emitting diode modules as claimed in claim 22.

* * * * *